(12) United States Patent
van Zuijlen et al.

(10) Patent No.: US 9,007,129 B2
(45) Date of Patent: Apr. 14, 2015

(54) AMPLIFER DEVICE

(71) Applicant: NXP B.V., Eindhoven (NL)

(72) Inventors: Albert Gerardus Wilhelmus Philipus van Zuijlen, Grave (NL); Vittorio Cuoco, Nijmegen (NL); Josephus Henricus Bartholomeus van der Zanden, Best (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/109,879

(22) Filed: Dec. 17, 2013

(65) Prior Publication Data

US 2014/0167858 A1    Jun. 19, 2014

(30) Foreign Application Priority Data

Dec. 18, 2012  (EP) .................................... 12197882

(51) Int. Cl.
*H03F 3/68* (2006.01)
*H03F 1/02* (2006.01)
(Continued)

(52) U.S. Cl.
CPC .............. *H03F 1/0288* (2013.01); *H01L 23/66* (2013.01); *H03F 3/195* (2013.01); *H01L 24/48* (2013.01); *H03F 3/45179* (2013.01); *H01L 2223/6611* (2013.01); *H01L 2223/6644* (2013.01); *H01L 2224/48247* (2013.01); *H01L 2224/49111* (2013.01); *H01L 2224/49175* (2013.01); *H03F 2203/45638* (2013.01); *H03F 2203/45731* (2013.01)

(58) Field of Classification Search
USPC ...... 330/295, 124 R, 307, 84, 126, 66, 67, 68
See application file for complete search history.

(56) References Cited

U.S. PATENT DOCUMENTS 4,614,878 A * 9/1986 Lauchner et al. ............. 307/106
4,647,869 A * 3/1987 Kaneko et al. ................ 330/286
(Continued)

FOREIGN PATENT DOCUMENTS

JP        9-260412 A     10/1997
WO    2007/003224 A1    1/2007

OTHER PUBLICATIONS

Extended European Search Report for Patent Appln. No. 12197882.9 (Jun. 3, 2013).

*Primary Examiner* — Henry Choe

(57) ABSTRACT

The disclosure relates to an amplifier device comprising an integrated circuit die (701a; 701b) having a first amplifier (702a; 702b) and a second amplifier. A Doherty amplifier may be implemented in accordance with the present invention. The amplifier device also comprises a first connector (706a; 706b) having a first end coupled to the first amplifier and a second end for coupling with a circuit board (718a; 718b), a second connector (708a; 708b) having a first end coupled to the second amplifier (704a; 704b) and a second end for coupling with a circuit board (718a; 718b), a shielding member (710a; 710b) having a first end coupled to the integrated circuit die (701a; 701b) and a second end for coupling with a circuit board (718a; 718b), the shielding member (710a; 710b) situated at least partially between the second connector and the first connector (706a; 706b) and a capacitor. The capacitor has a first plate and a second plate. The first plate of the capacitor is configured to be coupled to ground when in use. The second plate of the capacitor is coupled to one of the ends of the shielding member (710a; 710b). The other end of the shielding member (710a; 710b) is configured to be coupled to ground when in use.

15 Claims, 10 Drawing Sheets

(51) Int. Cl.
*H01L 23/66* (2006.01)
*H03F 3/195* (2006.01)
*H01L 23/00* (2006.01)
*H03F 3/45* (2006.01)

(56) References Cited

U.S. PATENT DOCUMENTS 5,973,568 A * 10/1999 Shapiro et al. ............... 330/295
6,300,827 B1 10/2001 King
7,215,205 B2 5/2007 Kitlinski et al.
7,683,480 B2 3/2010 Bokatius et al.
7,952,434 B2 * 5/2011 Shimizu et al. ............... 330/307
8,030,763 B2 10/2011 Romero et al.
2008/0048777 A1 2/2008 Kohjiro et al.
2009/0322430 A1 12/2009 Romero et al.
2012/0019326 A1 1/2012 Deguchi et al.
2012/0038420 A1 2/2012 Won et al.

* cited by examiner

AMPLIFER DEVICE

CROSS-REFERENCE TO RELATED APPLICATIONS

This application claims the priority under 35 U.S.C. §119 of European patent application no. 12197882.9, filed on Dec. 18, 2012, the contents of which are incorporated by reference herein.

The present disclosure relates to amplifier devices, specifically, although not exclusively, to multistage amplifiers that comprise a grounded shielding member and a capacitor coupled to the shielding member.

A base station technique is to combine the main and peak amplifiers of a Doherty amplifier in a single package. The base station component market utilizes dual path monolithic microwave integrated circuits (MMICs) in over molded plastic (OMP) package for applications such as drivers for dual input Doherty Amplifiers and single stage Doherty Amplifiers, for example. MMIC OMP implementations can offer cost benefits compared to other package implementations.

However, providing the main and peak amplifiers of a Doherty amplifier in a single package increases the risk of crosstalk (signal interference) between the signal paths of the main and peak amplifiers due to parasitic electromagnetic coupling at the input and output of the amplifiers. Crosstalk between the main and peak amplifiers should be minimized in order to provide an efficient Doherty amplifier. For some base station applications, a Doherty amplifier may be required to exhibit a crosstalk of less than −25 dB.

In accordance with an embodiment of the invention there is provided an amplifier device comprising:
- an integrated circuit die having a first amplifier and a second amplifier;
- a first connector having a first end coupled to the first amplifier and a second end for coupling with a circuit board;
- a second connector having a first end coupled to the second amplifier and a second end for coupling with a circuit board;
- a shielding member having a first end coupled to the integrated circuit die and a second end for coupling with a circuit board, the shielding member situated at least partially between the second connector and the first connector; and
- a capacitor with a first plate and a second plate, wherein the first plate of the capacitor is configured to be coupled to ground when in use, the second plate of the capacitor is coupled to one of the ends of the shielding member and the other end of the shielding member is configured to be coupled to ground when in use.

The provision of a capacitor can reduce the impedance of the shielding member at frequencies of interest. The provision of a capacitor may reduce the crosstalk between the main and peak amplifiers. The capacitor may be tuned to allow for an improved frequency response of the shielding member that reduces the return path impedance and so increases the portion of return current carried by the shielding member. The redistribution of return path current to the shielding member reduces the return current that crosses between the main and peak amplifier channels.

The amplifier device may be a Doherty amplifier device. The first amplifier may be a main amplifier. The second amplifier may be a peak amplifier.

The first and second amplifiers may be placed in parallel. The first amplifier connector may be a first amplifier input or output connector. The second amplifier connector may be a second amplifier input or output connector.

The amplifier device may be an integrated Doherty amplifier. The integrated circuit die may comprise the capacitor. The second plate of the capacitor may be directly coupled to the first end of the shielding member. The second plate of the capacitor may be indirectly coupled to the first end of the shielding member.

The amplifier device may comprise an integrated Doherty amplifier. The integrated Doherty amplifier may comprise the integrated circuit die. The second plate of the capacitor may be directly or indirectly coupled to the second end of the shielding member.

The shielding member may comprise a via through the integrated circuit die.

The capacitor may be a first capacitor. The amplifier device may comprise a second capacitor. The second capacitor may have a first plate and a second plate. The first plate of the first capacitor may be configured to be coupled to ground when the device is in use. The first plate of the second capacitor may be configured to be coupled to ground when the device is in use. The second plate of the first capacitor may be coupled to a first end of the shielding member. The second plate of the second capacitor may be coupled to a second end of the shielding member. The second capacitor may be a variable capacitor. Provision of a first and second capacitor can lighten the requirements for an external capacitor and so allow cheaper, lower capacity or generic capacitors to be used in various applications.

The capacitor may be a variable capacitor. The provision of a variable capacitor allows for the tuning of the impedance response of the shielding member.

The integrated circuit die may comprise a ground plane. The ground plane may be configured to be coupled to ground.

The first and second connectors and the shielding member may each extend in a common direction. The first and second connectors may each extend in a common direction. The first connector may be an input connector or an output connector of the amplifier device. The second connector may be an input connector or an output connector of the amplifier device.

The shielding member may comprise a shielding pin. The shielding pin may be configured to be coupled to the ground plane of the integrated circuit or a ground plane of the circuit board.

The amplifier device may comprise a plurality of capacitors positioned along a length of the shielding member. The plurality of capacitors may be spaced apart from one another. Each capacitor may be coupled between ground and a different point on the length of the shielding member.

The shielding member may comprise an inductor or inductors. The shielding member may comprise at least one of a bond wire, ribbon bond, leadframe, or clip leadframe.

The integrated Doherty amplifier may be provided by a single package. The provision of the amplifier in a single package can reduce manufacture costs.

Another aspect of the invention relates to an apparatus comprising the amplifier device and a circuit board coupled to a circuit board. The circuit board may be connected to the capacitor. The second ends of at least one of the first connector, second connector and shielding member of the amplifier device may be connected to the circuit board. The first plate of the capacitor may be coupled to a ground plane of the circuit board.

The invention will now be described by way of example, and with reference to the enclosed drawings in which.

Figure 4:
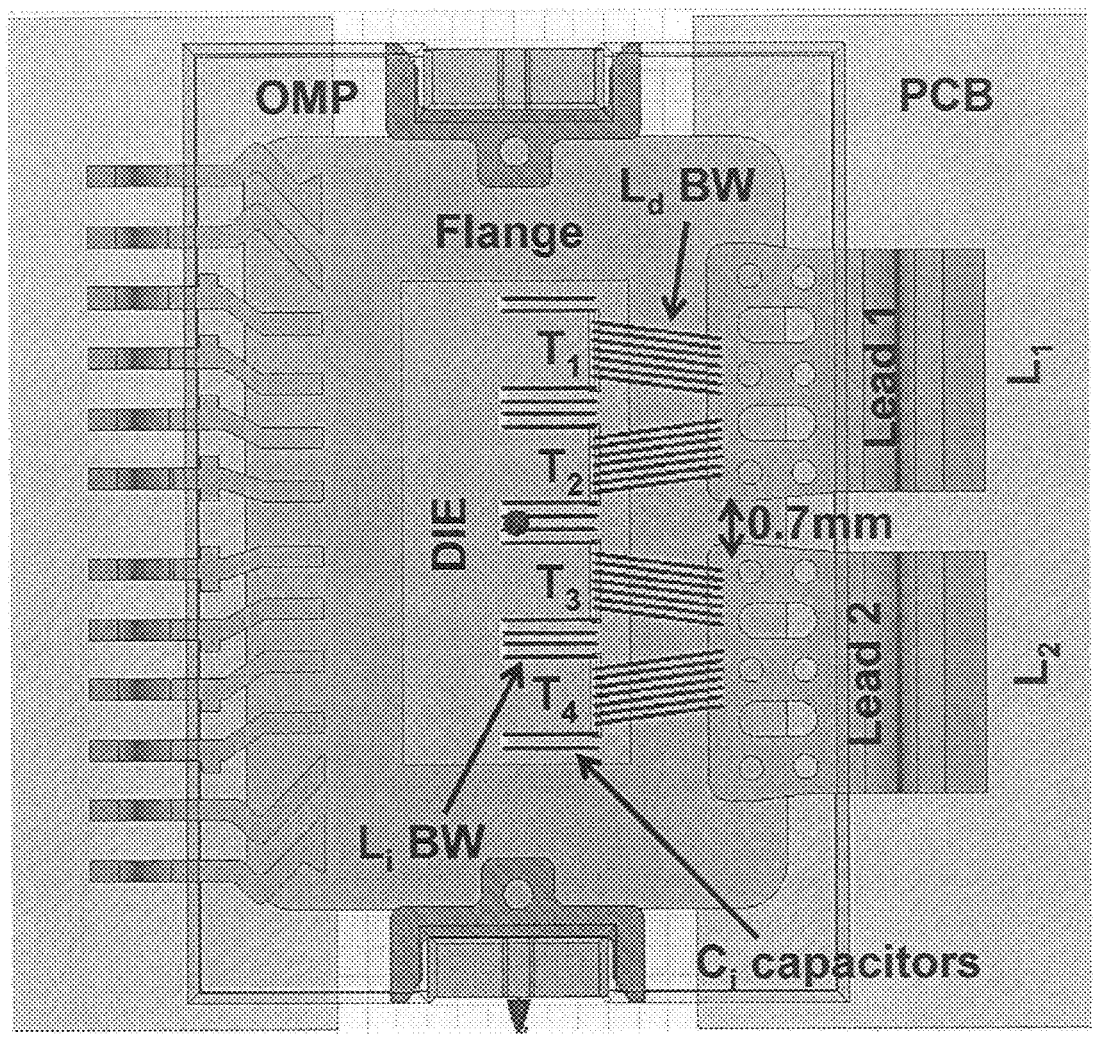
FIG. 4 shows a top view of an amplifier device.
Figure 7A:
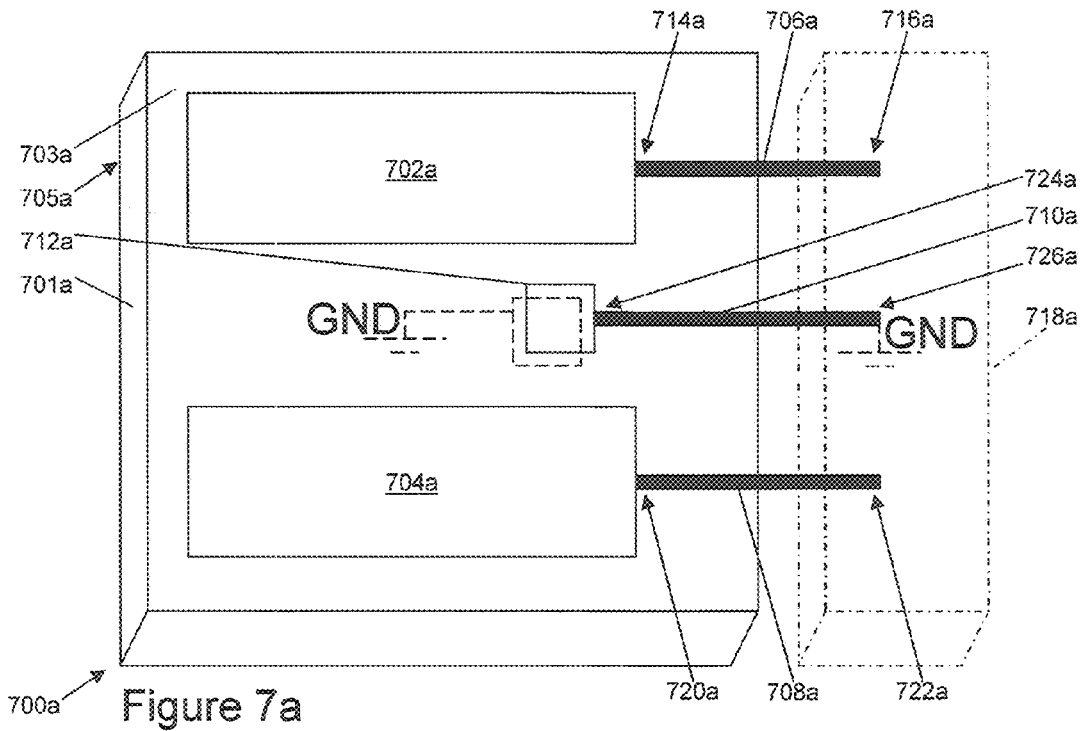
FIG. 7a shows a schematic of amplifier device that has a shielding member and a capacitor.
Figure 7B:
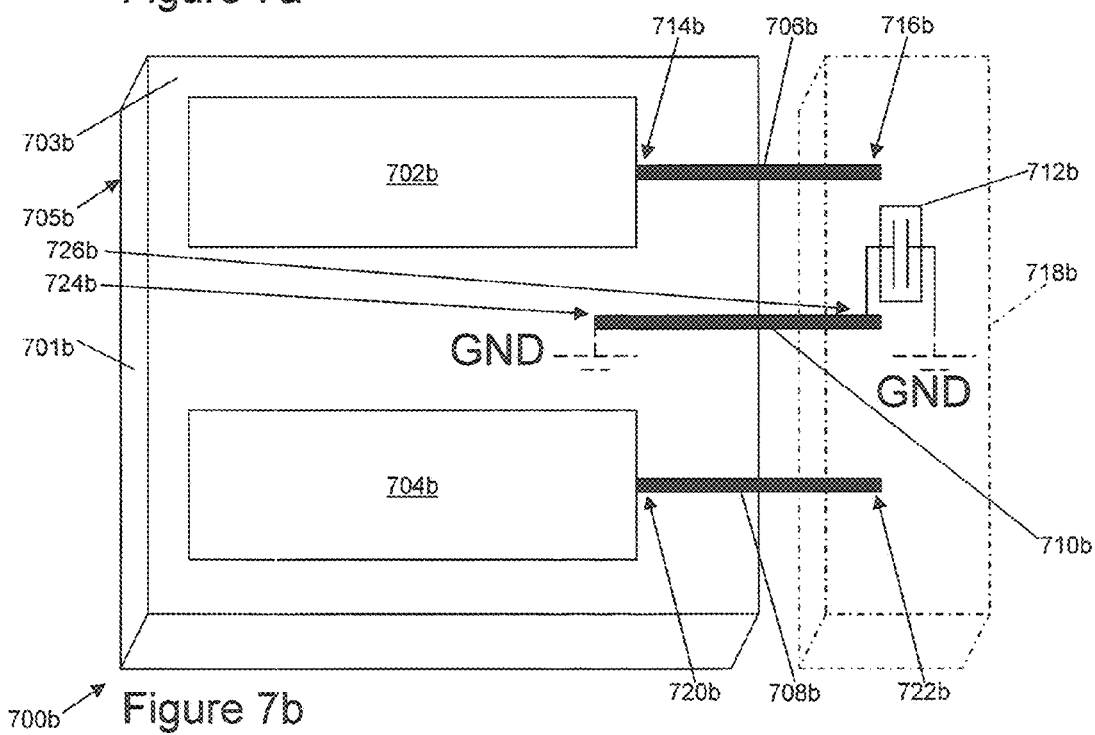
FIG. 7b shows a schematic of another amplifier device that has a shielding member and a capacitor.
Figure 9A:
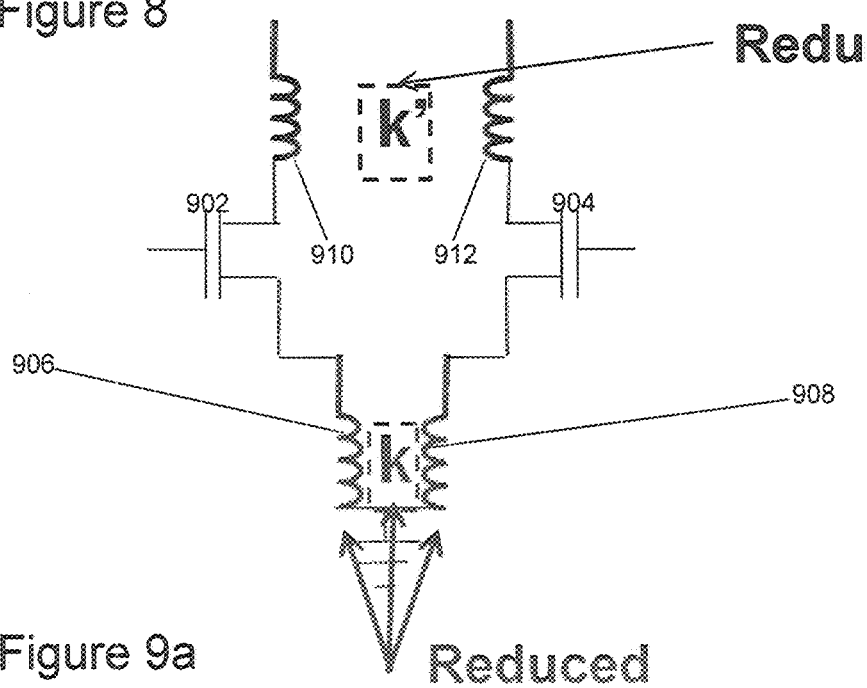
FIG. 9a shows an equivalent circuit diagram for the amplifier devices of FIG. 7.
Figure 9B:
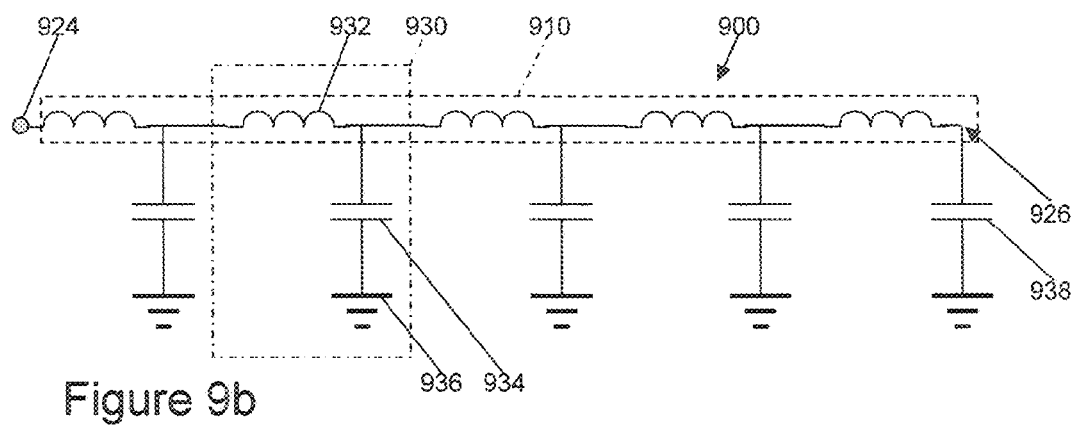
FIG. 9b shows a circuit diagram in which multiple capacitors are provided along a shielding member.
Figure 13:
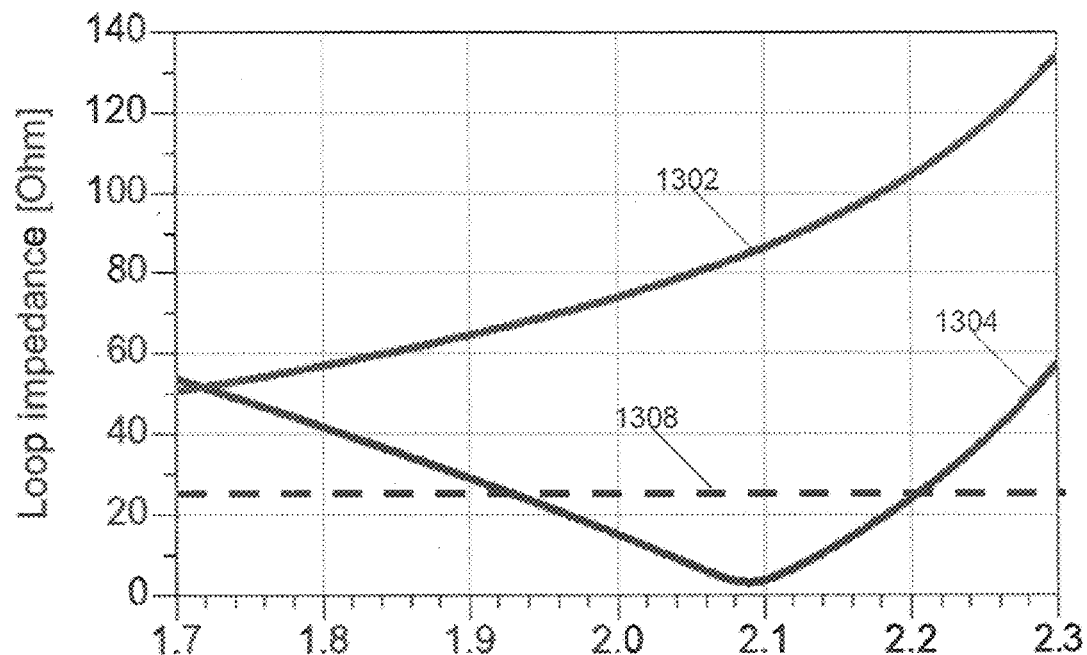
Figure 14:
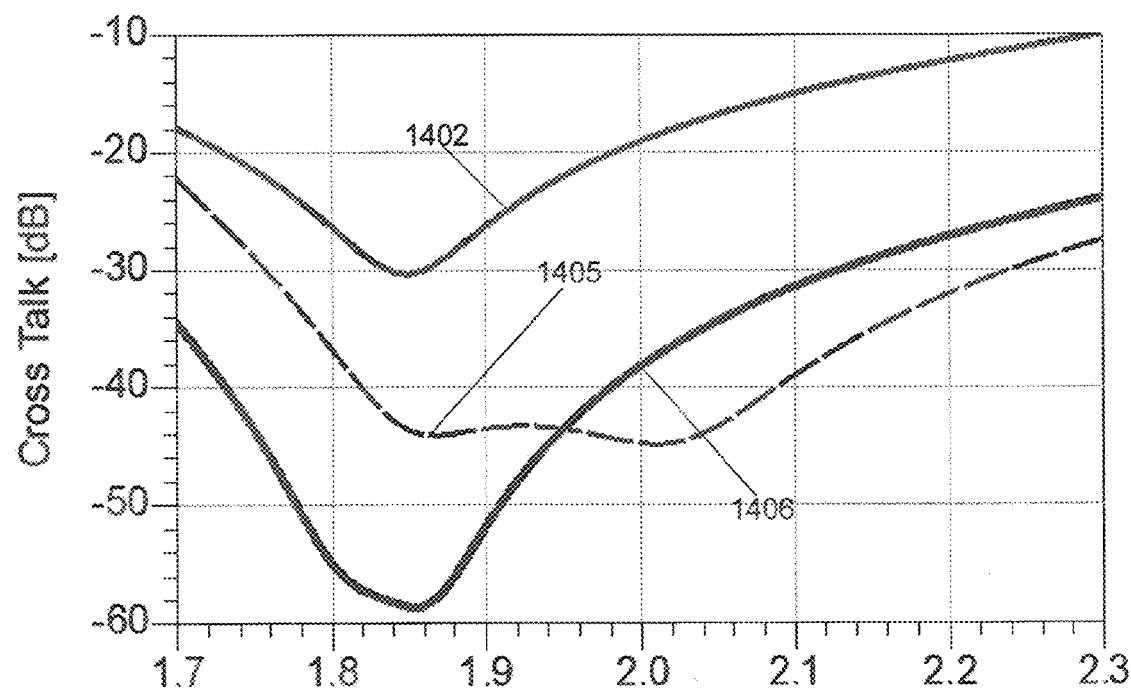

FIG. 13 shows plots of loop impedance against frequency for the amplifier device of FIG. 7b, an amplifier device that has a shielding member that is not coupled to a capacitor and an amplifier device comprising the shielding member and capacitor arrangement illustrated in FIG. 9b; and FIG. 14 shows a plot of crosstalk against frequency for the amplifier device of FIG. 4, the amplifier device of FIG. 7b and an amplifier device comprising the shielding member and capacitor arrangement illustrated in FIG. 9b.

One or more embodiments of the invention relate to reducing electromagnetic coupling between a first amplifier and a second amplifier provided in the same amplifier package by placing a shielding member (which may comprise a pin) in between the radio frequency (RF) leads of the first and second amplifiers. The shielding pin is connected to a printed circuit board (PCB) ground outside the package and to the contact of a die inside the package through a bond wire. Some embodiments of the invention lower the electromagnetic coupling between RF leads, bond wires and a return current path of the amplifier. A capacitor is also provided to improve the radio frequency response of the shielding member. The RF response of the shielding pin can be adapted by modifying the value of the capacitor to better match the requirements of a target application. Embodiments of the invention can be used to implement an integrated Doherty amplifier that exhibits less crosstalk.

For an amplifier composed of a single transistor the RF return current can pass through a flange of the transistor. The detrimental effect of the resulting source inductance on the transistor RF performance may be considered to be acceptable for many applications. However, in the case where two amplifiers are provided in the same package, not only the source inductance value of each amplifier matters but also the mutual coupling between loop inductances (each current loop provided by the combination of the forward and return paths) of the two amplifiers.

Figure 1:
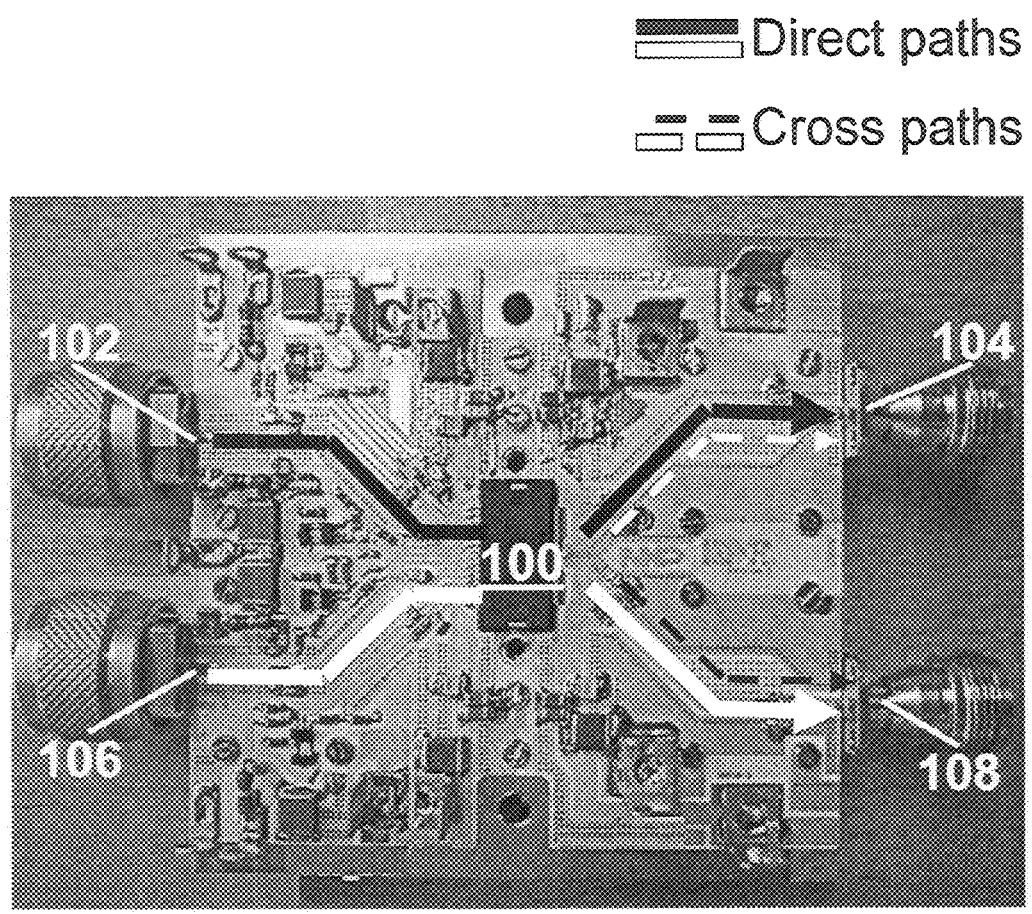
FIG. 1 shows a circuit board comprising a dual path overmolded plastic monolithic microwave integrated circuit.

FIG. 1 shows a circuit board comprising a dual path overmolded plastic monolithic microwave integrated circuit 100. This is a typical application setup composed of a first amplifier and a second amplifier in a single package. The first and second amplifiers can relate to main and peak amplifiers in a Doherty amplifier implementation. The first amplifier has a first input 102 and a first output 104. The second amplifier has a second input 106 and a second output 108. Direct path signals are signals that appear at the output of an amplifier that relate to signals received at the input to the same amplifier. In an ideal case the signal obtained at the first output 104 should relate only to the signal received at the first input 102 (direct path shown as a solid line). Similarly, the signal received at the second input 108 should relate only to the signal received at the second input 106 (direct path shown as a solid line).

However, in a real situation the first and second amplifiers in the package are electromagnetically coupled due to the parasitic coupling of their source inductances. As a result, part of the signal at the first input 102 affects the signal at the second output 108 (cross path shown as a dashed line) and the signal at the second input 106 affects the signal at the first output 104 (cross path shown as a dashed line). Cross path signals are signals that appear at the output of an amplifier that relate to signals received at the input to another amplifier. These interference signals are an unwanted effect that is detrimental to Doherty amplifier performance.

Figure 2:
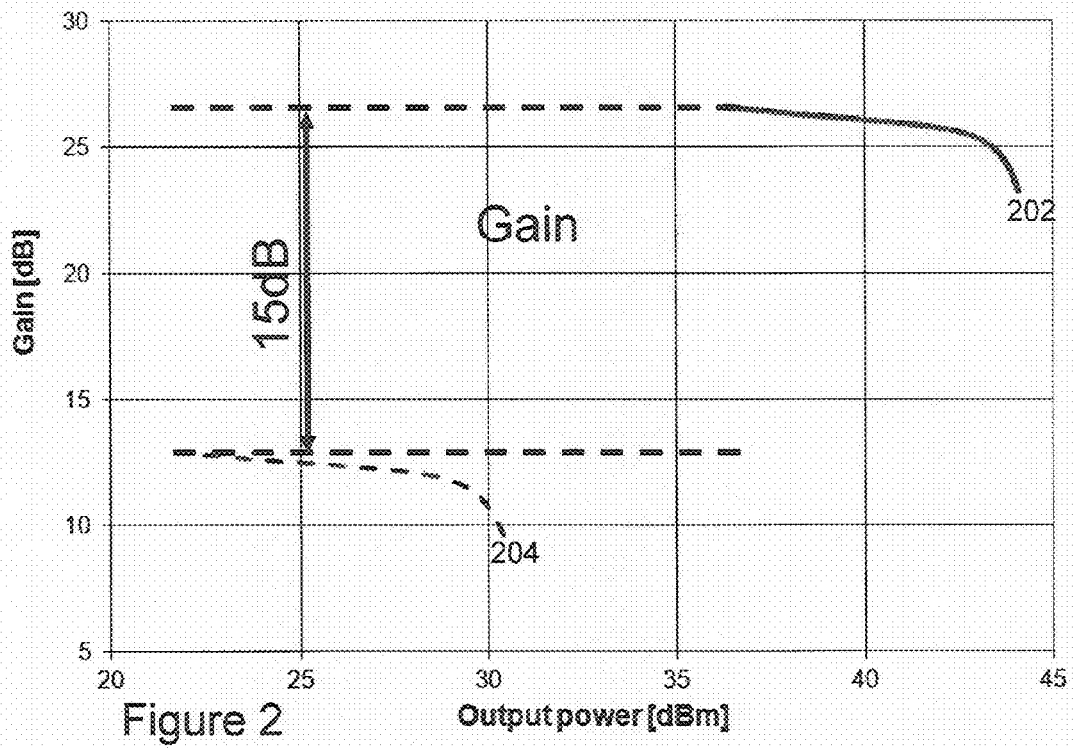
FIG. 2 shows gain against output power for direct and cross path signals for the integrated circuit of FIG. 1.

FIG. 2 shows gain against output power for a direct path signal 202 and a cross path signal 204 for the integrated circuit shown in FIG. 1. The difference between the gain in a direct path 202 and a cross-path 204 is referred to as crosstalk. Measurements show that a typical isolation between the two amplifiers in a dual-in-package (OMP MMIC) configuration, such as that illustrated in FIG. 1, is of the order of −15 dB. This value may not be considered to be acceptable in many applications, such as Doherty amplifiers for base stations for example. A crosstalk of less than −25 dB may be required in some Doherty amplifier applications.

Figure 3:
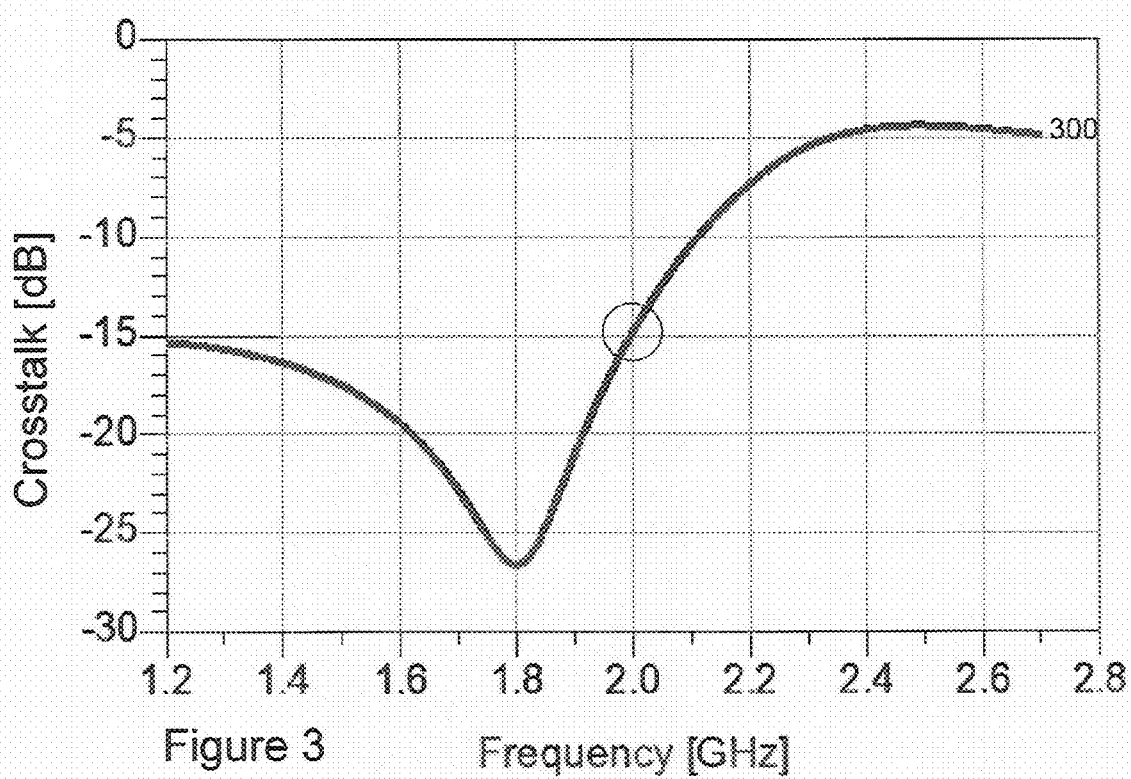
FIG. 3 shows crosstalk against frequency for the integrated circuit of FIG. 1.

FIG. 3 shows a plot 300 of crosstalk against frequency for the integrated circuit shown in FIG. 1 operating at a constant output power. The measurement results are confirmed by combined 3D elemental mapping and circuit simulations of the packaged amplifiers. The plot 300 has a minimum at 1.8 GHz, where the crosstalk value is around −27 dB. At a desired operating frequency of 2.0 GHz, the crosstalk is −15 dB, which is higher than the −25 dB required in some applications.

FIG. 4 shows a schematic representation of a top view of a single-die, single-package amplifier product in over-mould-plastic (OMP). The device is provided on a single die and comprises first and second amplifiers, which may be a peak amplifier and a main amplifier in a Doherty amplifier implementation. The first amplifier comprises a first transistor T1 and a second transistor T2. The second amplifier comprises a third transistor T3 and a fourth transistor T4. The first amplifier has a first input lead (not shown) and a first output lead L1. The second amplifier has a second input lead (not shown) and a second output lead L2. The first and second transistors T1, T2 are coupled to the first output lead by output bond wires Ld. The third and fourth transistors T3, T4 are coupled to the second output lead by output bond wires Ld also.

Matching capacitors Ci are provided adjacent to the transistors T1-T4 in order to, in combination with Li bondwires, improve the frequency response of the amplifier for a given application.

Figure 5A:
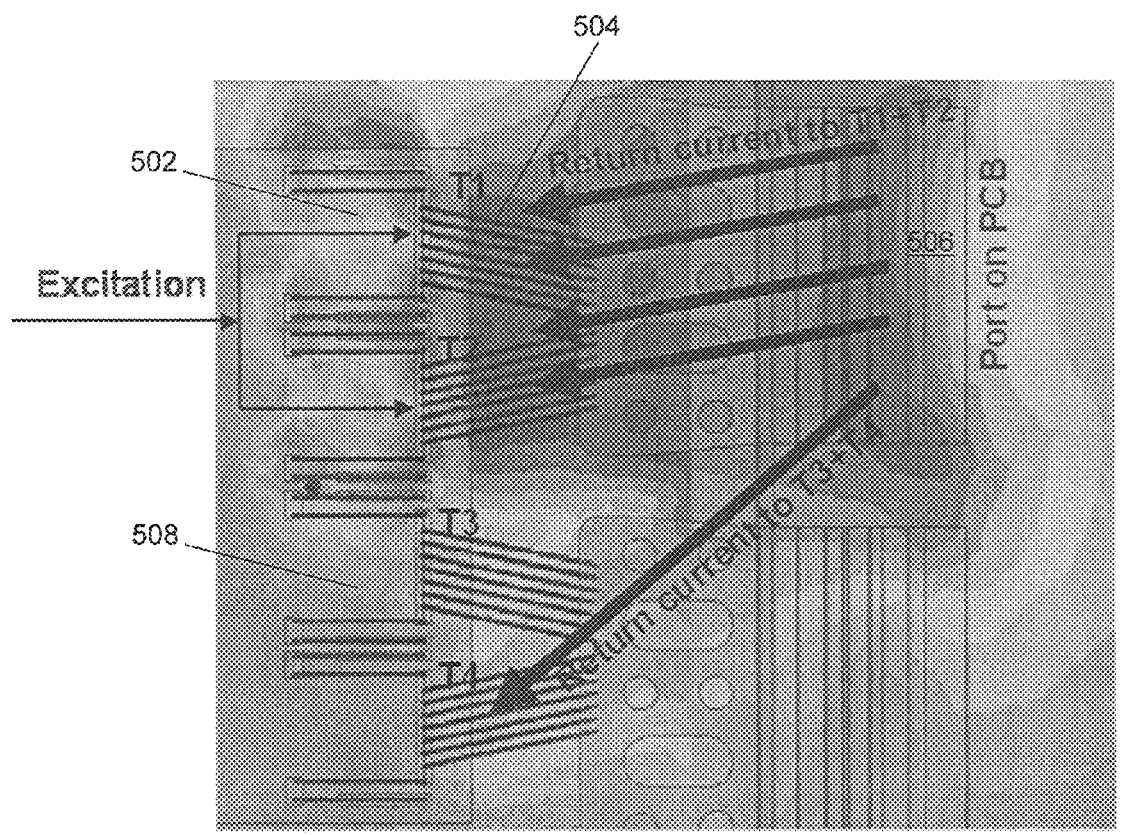
FIG. 5a shows return current density values superimposed on a portion of the schematic of FIG. 4.

FIG. 5a shows a simulation of the current density of a return path current superimposed on a portion of the schematic of FIG. 4 when the device is operating at 2 GHz.

The return current is in response to excitation of the first amplifier 502. The highest current density can be seen around first output bond wires 504 that are between the first output lead 506 and the first amplifier 502. However, it can be seen that return current is also present between the first output lead 506 and the second amplifier 508. The simulation therefore indicates that an origin of the diminished isolation between the signal paths of the first and second amplifiers 502, 508 is coupling between the source impedance of the two amplifiers. That is, part of the return current of one amplifier is being diverted toward the other. This coupling can be seen, from a circuit point of view, as a common inductance, as illustrated in FIG. 5b.

Figure 5B:
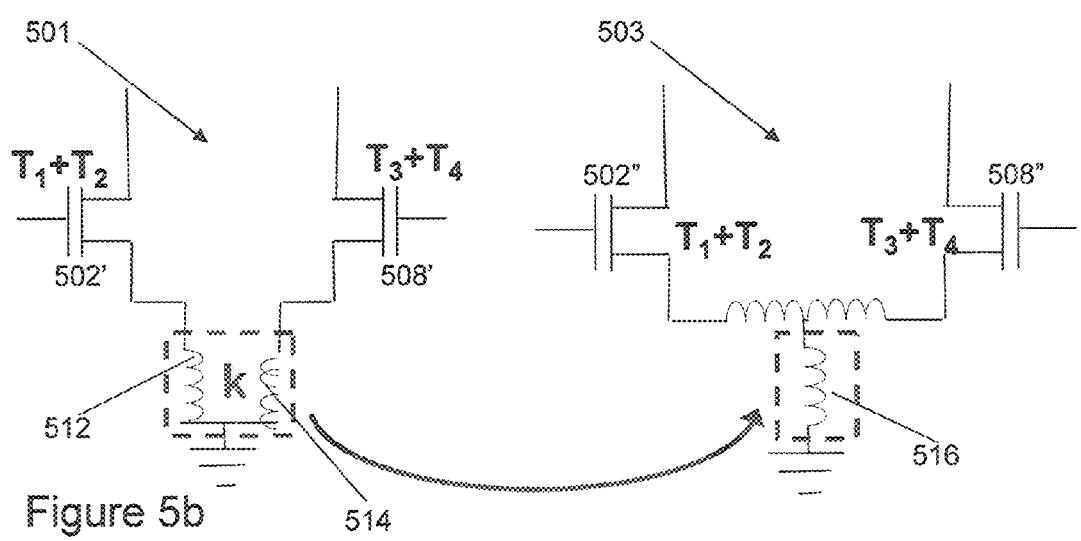
FIG. 5b shows an equivalent circuit diagram for the amplifier device of FIG. 4.

FIG. 5b shows a first model circuit 501 and a second model circuit 503 that represent alternative equivalent circuit diagrams for the amplifier of FIG. 4. In the first model 501, the amplifiers 502', 508' are coupled to ground by respective separate inductors 512, 514. The separate inductors 512, 514 are electromagnetically coupled by a coupling factor k. However, in the second model 503, the electromagnetic coupling between the source impedance of the first and second amplifiers 502", 508" can be considered as a common inductance 516 between the first and second amplifiers 502", 508" and ground.

Figure 6A:
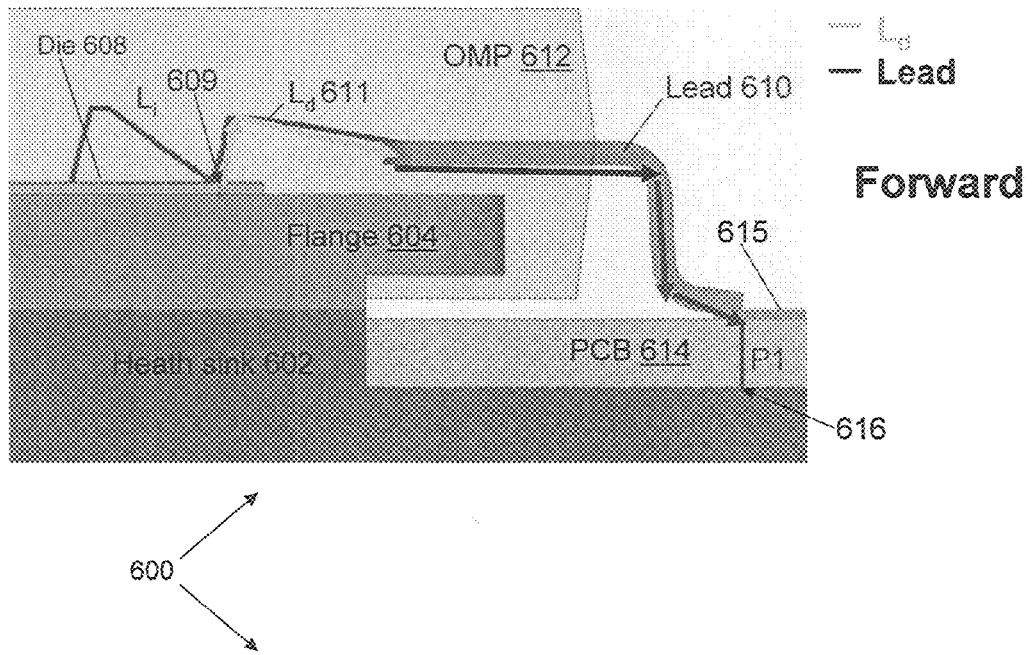
FIG. 6a shows a schematic representation of the return path of the amplifier device of FIG. 4.
Figure 6B:
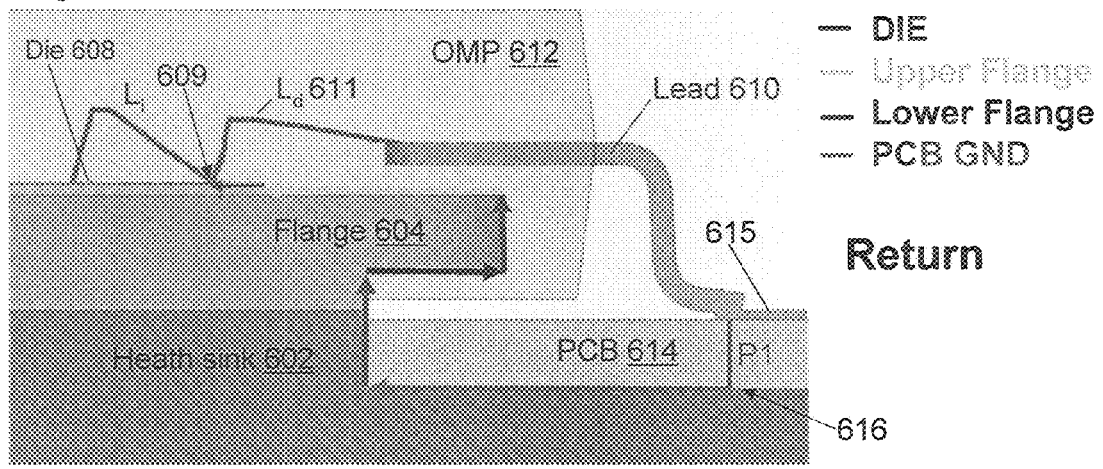
FIG. 6b shows a cross sectional representation of the return path of the amplifier device of FIG. 4.

FIGS. 6a and 6b show cross-sectional side views of cross sectional representations of forward and return current paths of the amplifier device of FIG. 4. The forward current path is shown in FIG. 6a. The return current path is shown in FIG. 6b.

From the side view it can be seen that the amplifier comprises a heat sink 602 that extends in a plane that is perpendicular to the view. A circuit board 614 is disposed within the plane of the heat sink 602 such that an underside of the heat sink is in contact with the circuit board 614.

A flange 604 is situated on top of the heat sink 602. A transistor or integrated circuit die 608 is situated on the flange 604. Matching bond wires Li are provided on the die 608. An output bond wire Ld couples the die 608 to an output pin or output lead 610. A portion of the output lead 610 is within the overmold package 612 of the device. Another portion of the output lead 610 protrudes from the device and is couplable to the circuit board 614. In the examples shown, the lead 610 is coupled to a contact 615 on the circuit board 614 by solder. A ground plane 616 is provided on an opposite surface of the circuit board 614 to the contact 615.

In FIG. 6a, the path of the forward current of the output signal is superimposed on to the structure of the device 600. The forward current originates at an output 609 of a transistor on the die 608. The forward current is then conveyed by the output bond wire Ld 611 to the output lead 610. The output lead 610 provides the forward current to the contact 615 on the circuit board 614.

In FIG. 6b, the path of the return current of the output signal is superimposed on to the structure of the device 600. The return current takes a different path to the forward current. The return current can be considered to originate at the contact 615 between the lead 610 and the circuit board 614. The return current passes through a matching circuit on the circuit board 614 and along the bottom of the circuit board 614. The return current is then conducted within a skin depth of the heatsink 602 and around the flange 604 back to the point 609 of the die 608 that is connected to the output bond wires Ld 611.

The forward current path combined with the return current path forms a current loop. It has been found that it is these current loops that provide the electromagnetic fields that cause the crosstalk between the two amplifiers.

It will be appreciated that crosstalk may also be experienced between the input leads of a single chip dual amplifier.

Embodiments of the present invention provide a means to reduce the coupling between the amplifiers, as will be better appreciated by reference to the following description.

FIGS. 7a and 7b show schematics of two amplifier devices 700a; 700b, which may be Doherty amplifier devices. The two amplifier devices 700a; 700b comprise many common features. Each of the amplifier devices 700a; 700b comprise an integrated circuit die 701a; 701b that has a first amplifier 702a; 702b and a second amplifier 704a; 704b. In Doherty amplifier implementations, the first amplifier 702a; 702b may be a main amplifier and the second amplifier 704a; 704b may be a peak amplifier.

The integrated circuit die 701a; 701b is planar in this example and has a first side 703a; 703b and a second side 705a; 705b. The first side 703a; 701b of the integrated circuit die 701a; 701b opposes the second side 705a; 705b.

The first amplifier 702a; 702b and the second amplifier 704a; 704b may be provided on the first side 703a; 703b of the integrated circuit die 701a; 701b. The devices 700a, 700b also comprise a first connector 706a; 706b, a second connector 708a; 708b, a shielding member 710a; 710b and a capacitor 712a; 712b.

A circuit board 718a; 718b is also illustrated in both FIG. 7a and FIG. 7b. The amplifier device 700a; 700b is connected to the circuit board 718a; 718b by the first connector 706a; 706b and second connector 708a; 708b. However, it will be appreciated that the circuit board 718a; 718b is not an essential feature of the invention in some embodiments.

The first connector 706a; 706b has a first end 714a; 714b coupled to the first amplifier 702a; 702b and a second end 716a; 716b for coupling with the circuit board 718a; 718b. The first connector 706a; 706b may be a first amplifier input or output pin.

The second connector 708a; 708b has a first end 720a; 720b coupled to the second amplifier 704a; 704b and a second end 722a; 722b for coupling with the circuit board 718a; 718b. The second connector 708a; 708b may be a second amplifier input or output pin.

The shielding member 710a; 710b has a first end 724a; 724b coupled to the integrated circuit die and a second end 726a; 726b for coupling with the circuit board 718a; 718b. The shielding member 710a; 710b can comprise a bond wire that extends between the first end 724a; 724b and the second end 726a; 726b of the shielding member 710a; 710b. In other embodiments, the shielding member 710a; 710b may comprise a bond wire in series with a ground connector/pin. The shielding member 710a; 710b is situated at least partially between the second connector 708a; 708b and the first connector 706a; 706b. Both ends of the shielding member 710a; 710b are coupled directly or indirectly to ground when the device is in use. The shielding member can be considered to form an electrical loop with ground in between the first connector 706a; 706b and second connector 708a; 708b. The loop may be considered as a ground-lead-bondwire-ground loop. This loop creates a current loop which acts as a magnetic shield that significantly reduces the coupling between the connectors of the first and second amplifiers 702a; 702b, 704a; 704b. That is, the shielding member 710a; 710b reduces the coupling between the loop inductances of the first and second amplifiers 702a; 702b, 704a; 704b. The shielding member also provides an alternative path for return current and reduces the return path inductance and coupling coefficient (k) between the first and second amplifiers 702a; 702b, 704a; 704b. The coupling coefficients between the forward paths of the first and second amplifiers 702a; 702b, 704a; 704b are also reduced, or shielded, by the shielding member 710a; 710b.

The shielding member current loop also reduces the value of the source inductance itself, which may also be beneficial to the RF performance of the amplifier 700a, 700b. The improvement in circuit properties derived from the shielding member will be described further with reference to FIGS. 10 to 12.

The first connector 706a; 706b, second connector 708a; 708b and shielding member 710a; 710b each extend in a common direction in the examples illustrated in FIGS. 7a and 7b.

The capacitor 712a; 712b, which has a first plate and a second plate, is also provided within the shielding member ground loop. However, the arrangement of the capacitor within the loop differs for the amplifier device 700a shown in FIG. 7a and the amplifier device 700b shown in FIG. 7b. As a general statement that covers both the devices shown in FIGS. 7a and 7b, the first plate of the capacitor 712a; 712b is configured to be coupled to ground when in use, the second plate of the capacitor 712a; 712b is coupled to one of the ends 724a; 726b of the shielding member 710a; 710b and the other end 726a; 724b of the shielding member 710a; 710b is configured to be coupled to ground when in use.

The amplifier device 700a shown in FIG. 7a is an integrated amplifier, which can be an integrated Doherty amplifier and can be provided by a single package. The integrated circuit die 701a comprises the capacitor 712a. In this example, the first plate of the capacitor 712a is provided on the second side 705a of the integrated circuit die 701a that opposes the first side 703a. The first plate of the capacitor 712a is configured to be coupled to ground when the device is in use. Any connections to ground that are required within the amplifier device 700a may be provided by a ground pin (not shown) on the device 700a that can connect to a ground plane of the circuit board 718a, as is known in the art. Such a ground pin can be internally coupled to a ground plane of the device 700a.

The second plate of the capacitor 712a is situated on the first side 703a of the die 701a. The second plate of the capacitor 712a is coupled to the first end 724a of the shielding member 710a. It will be appreciated that the integrated capacitor 712a could be implemented in any other way. The second end 726a of the shielding member 710a is configured to be coupled to ground at the circuit board 718a. In FIG. 7a, the ground coupling at the second end 726a of the shielding member 710a may be provided by a ground plane (not shown) of the circuit board 718a. A via may can be provided through the circuit board between the shielding member 710a and the ground plane of the circuit board 718a.

The amplifier device 700b shown in FIG. 7b comprises an integrated amplifier which can be an integrated Doherty amplifier and comprises the components provided by the integrated circuit die 701b. In this example, the capacitor 712b is provided as a separate, discrete component from the integrated circuit die 701b and may be considered to be part of the amplifier device 700b, but not part of the integrated amplifier. The capacitor may be a variable capacitor in this example so as to allow tuning of the frequency response of the shield member ground loop. The first plate of the capacitor 712b is configured to be coupled to ground when the device 700b is in use by, for example, coupling with a ground plane or ground track of the circuit board 718b. The second plate of the capacitor 712b is coupled to the second end 726b of the shielding member 710a. The first end 724b of the shielding member 710b is coupled to ground when in use by, for example, a contact on the surface of the integrated circuit die 701b and a via through the integrated circuit die 701b. The via couples the first end 724b of the shielding member 710b with a ground plane of the die 701b. The contact can be located on top of the integrated circuit die 701b. In some examples, a low ohmic substrate is provided so that the whole of the substrate of the integrated circuit die 701b acts as a via. In the case where the integrated circuit die 701b has a high ohmic substrate, a real via through the die may be provided.

In other examples, the an "active" die 701a, 701b may be combined with a separate "passive" die that comprises a MOS capacitor. In such examples, the shielding member may be connected to a plate of the MOS capacitor on the passive die, rather than to the active die. The MOS capacitor on may also have a ground contact plate.

In implementations where more than two amplifiers are provided within a package, a shielding member may be provided between the connections of each amplifier. The additional shielding members may have similar electrical properties to the shielding member discussed with reference to FIGS. 7a and 7b in order to reduce the crosstalk between each of the amplifiers.

It will be appreciated that two capacitors may be provided in series in the shielding member ground loop in some examples. A first capacitor may be provided on the die and a second capacitor may be provided on (or configured to be connected to) a circuit board. A first plate of both of the first and second capacitors is configured to be coupled to ground. Second plates of the respective first and second capacitors are coupled to one another through the shielding member. The first capacitor may have a fixed value and be used to provide a coarse level of impedance control. The second capacitor may be a variable capacitor and so be used to fine-tune the impedance response of the shielding member. Implementations of this example may reduce the capacitance requirement of the variable capacitor and so allow for more precise control of the impendence. Additionally, the reduced capacitance requirement of the variable capacitor may allow for the use of a less expensive variable capacitor. However, when two capacitors are provided in series a higher capacitance may be required outside the package to achieve the same effective value.

The term "electrically coupled" or "coupled" may mean that a component has a direct or indirect electrical connection with another component to allow electrical conduction. A "coupling" may allow a significant electronic current flow between the features that it couples. The term "coupled" is reserved for such electrical coupling herein. "Capacitive coupling" or "inductive coupling" may be referred to herein as "electromagnetic coupling", meaning "electromagnetic field coupling". A "connection" may refer to an electrical connection or to a physical connection between two components.

Figure 8:
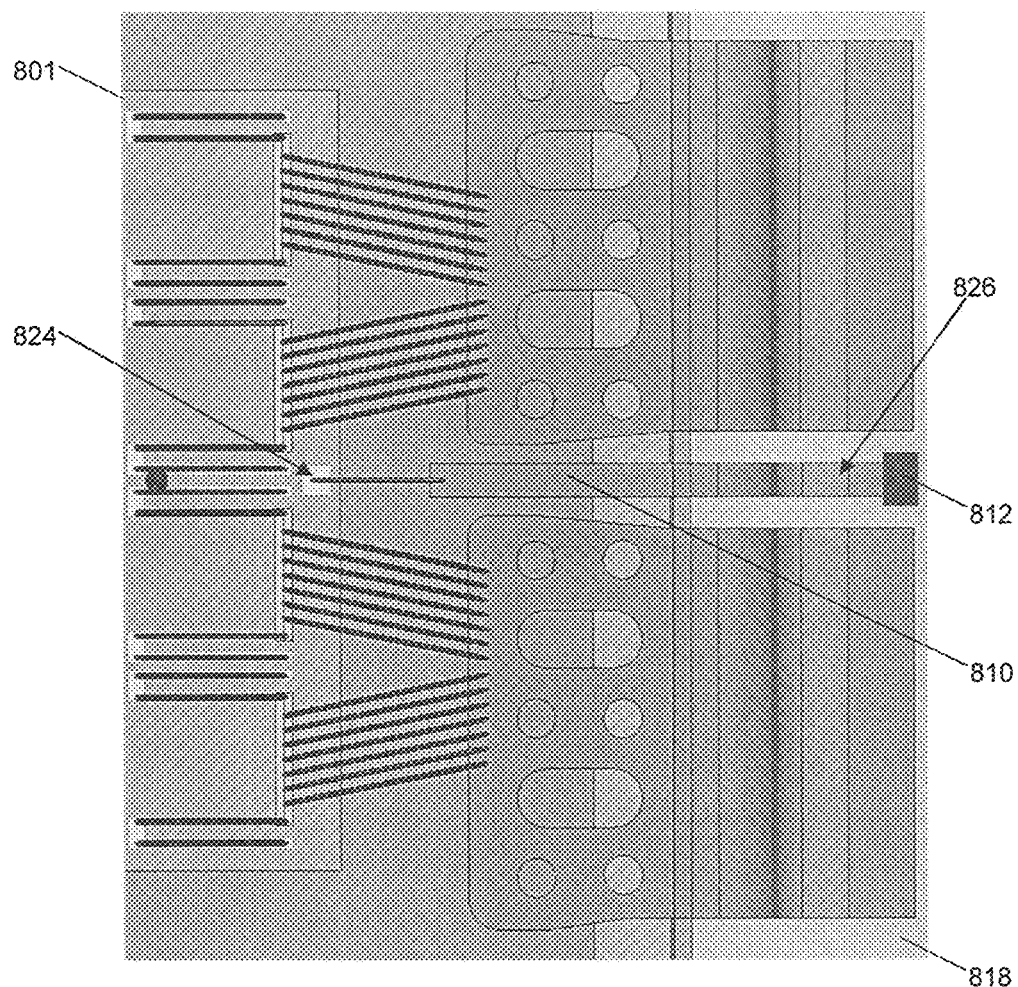
FIG. 8 shows another view of the amplifier device of FIG. 7b.

FIG. 8 also shows a schematic of a device 800 based on the device illustrated in FIG. 4. The device 800 of FIG. 8 comprises a shielding member 810 and a capacitor 812 in addition to the components of the device of FIG. 4. The arrangement of the shielding member 810 and the capacitor 812 is similar to that illustrated in FIG. 7b.

A shielding path can be considered to start at a ground plane of a die 801. The ground plane of the die 801 is coupled to the shielding member 810 at a first end 824 of the shielding member 810. The shielding member 810 comprises a bond wire at its first end 824 and a pin, or lead, at its second end 826. The bond wire and the pin are in series with each other. The second end 826 of the shielding member 810 is coupled to a second plate of the capacitor 812. The first plate of the capacitor 812 is coupled to a ground plane of a circuit board 818. Alternatively, the second plate of the capacitor 812 may be provided on a surface of the circuit board 818 that opposes a surface on which the ground plane is provided. The first plate of the capacitor 812 may be comprised by the ground plane of the circuit board 818 in such an example. The ground plane of the circuit board 818 and the ground plane of the die 801 can be in direct electrical contact with one another, for example, they may be connected by a ground pin of an integrated circuit package that houses the die 801.

FIG. 9a shows an equivalent circuit diagram for the amplifier device of FIGS. 7 and 8. The coupling coefficient (k') between the output bond wires/leads 910 of the first amplifier 902 and the leads 912 of the second amplifier 904 is reduced by the provision of the shielding member. The first source inductance 906 of the first amplifier 902 and the second source inductance 908 of the second amplifier 904 are also reduced by the shielding member, as is the coupling coefficient (k) between the first source inductance 906 and second source inductance 908. The effect of the shielding member is indicated in FIG. 9, although the shielding member itself is not shown. The shielding member is provided between leads 910 of the first amplifier 902 and the leads 912 of the second amplifier 904.

FIG. 9b illustrates a multi-unit LC circuit 900 that provides a shielding member 910 and multiple capacitors 934. The shielding member 910 provides an inductance, which can be considered to be a number of inductors 932 coupled in series. The shielding member 910 has a first end 924 and a second end 926. The first end 924 of the shielding member 910 may be coupled to a ground plane of a die. The second end 926 of the shielding member 910 may be coupled to a ground plane of a circuit board. In the example shown in FIG. 9b, the second end 926 of the shielding member 910 is coupled to ground via a capacitor 938.

Multiple LC units 930 are provided between the first end 924 of the shielding member 910 and ground at the second end 926 of the shielding member 910. Each LC unit 930 comprises an inductor 932 of the shielding member 910 and a capacitor 934. The inductor 932 has a first terminal and a second terminal and the capacitor 934 has a first plate and a second plate. The first plate of each capacitor 934 is coupled to the second end of the inductor 932. The second plate of each capacitor 934 is coupled to ground 936.

The first end of the inductor 932 of the first of the LC units 930 is coupled to the first end 924 of the shielding member 910. LC units 930 are added incrementally to the first LC unit, from left to right in the example of FIG. 9b. The first terminal of the inductor 932 of a subsequent LC unit 930 is connected to the second terminal of the inductor of a previous LC unit. The second terminal of the inductor of the last of the LC unit can be considered to be the second end 926 of the shielding member 910.

The effect of providing multiple capacitors 934 spaced apart along the shielding member 910 is that the impedance of the shielding member 910 may be reduced. It will be appreciated that parts of the shielding member 910 and the capacitors 934 may be provided on an integrated circuit, on a circuit board or between the integrated circuit and circuit board. The shielding member 910 and capacitors 934 can be considered as a shielding fence, where the capacitors 934 provide vertical fence elements and the inductors 932 of the shielding member 932 provide horizontal fence elements.

Another effect of the provision of multiple capacitors 934 along the shielding member 910 is that the cross talk and the loop impedance of a device incorporating the shielding member 934 become more suited to broadband applications, as will be discussed further with respect to FIGS. 13 and 14 below.

Figure 10A:
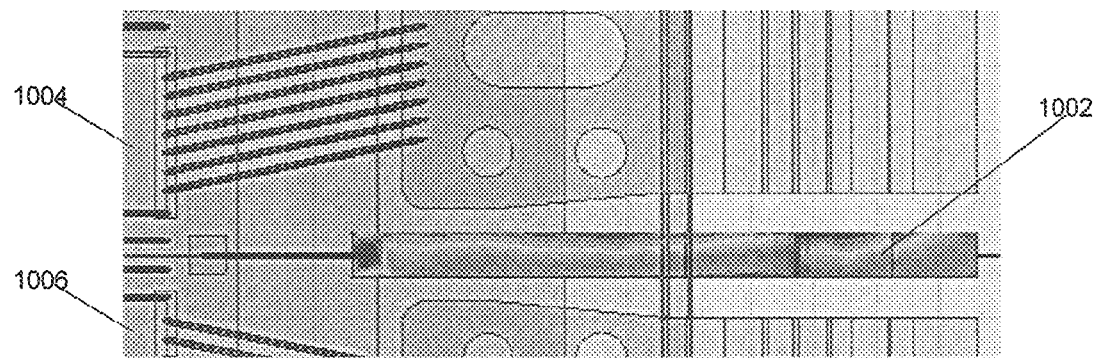
FIG. 10a shows return current density values superimposed on a portion of the schematic of FIG. 8.
Figure 10B:
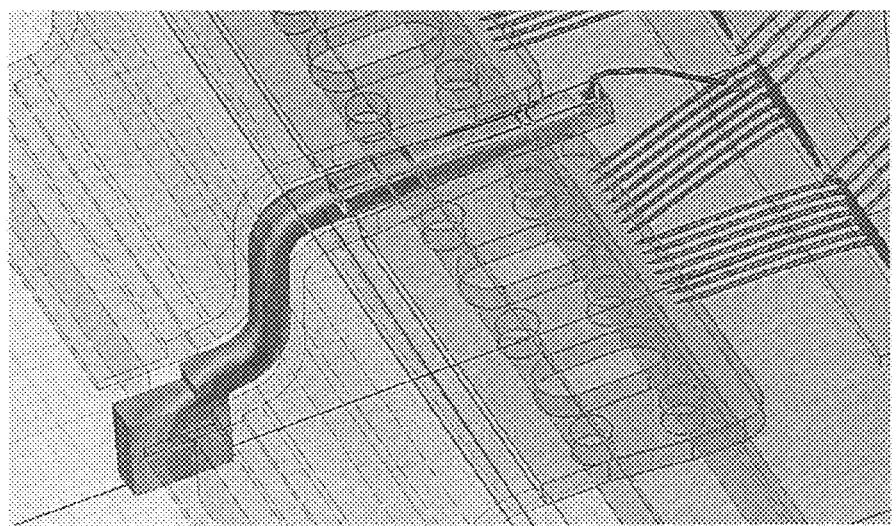
FIG. 10b shows return current density values superimposed on a perspective view of the schematic of FIG. 8.

FIG. 10a shows return current density values superimposed on a portion of the schematic of FIG. 8. FIG. 10b shows return current density values superimposed on a perspective view of the schematic of FIG. 8.

The simulation results illustrated in FIG. 10 show that the shielding member 1002 carries most of the return current. The shielding member 1002 therefore not only acts as a magnetic shield between the current loops of the two amplifiers 1004, 1006, but it also reduces the return path impedance.

In the simulation shown, only the first amplifier 1004 is active. The current density of the shielding member 1002 is therefore highest on the side of the active first amplifier 1004; the shielding member 1002 acts as a mirror to the current from a loop of the first amplifier 1004. The shielding member may be configured to carry a significant amount of return current.

Figure 11:
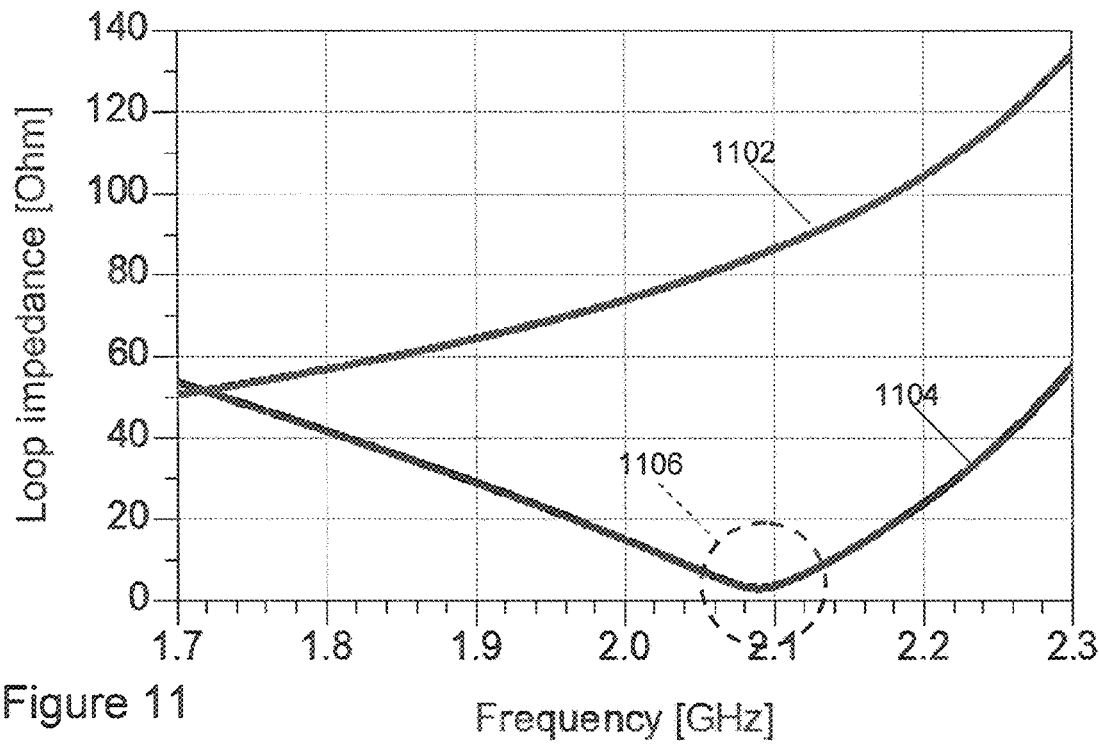
FIG. 11 shows plots of loop impedance against frequency for the amplifier device of FIG. 7b and an amplifier device that has a shielding member that is not coupled to a capacitor.

FIG. 11 shows a plot of loop impedance against frequency for two different amplifier devices that have shielding members as disclosed herein. A first plot 1102 illustrates the impedance response of an amplifier with a shielding member without a capacitor. A second plot 1104 illustrates the impedance response of an amplifier having a shielding member with a capacitor situated off the die of the amplifier, such as the examples shown in FIG. 7b or 8.

The first plot 1102 has an impedance of 50 ohms at 1.7 GHz, which increases to around 135 ohms at 2.3 GHz. The gradient of the first plot 1102 also increases with frequency.

The second plot 1104 has an impedance of around 55 ohms at 1.7 GHz. The second plot 1104 impedance decreases in an approximately linear manner to around 5 ohms at around 2.09 GHz (highlighted circle 1106). At frequencies above 2.09 GHz the impedance and gradient of the second plot 1104 increases with frequency. The second plot 1104 impedance is around 60 ohms at 2.3 GHz.

It can be seen from FIG. 11 that the provision of a capacitor coupled to the shielding member reduces the total impedance of the ground loop for a wide range of frequencies. Also the frequency response of the impedance may be tuned by altering the value of the capacitor. A variable capacitor can be provided to allow for such control of the shielding loop impedance. For this reason it is preferable, although not essential, that the capacitor is provided on the circuit board side since, in this way, the capacitor can be tuned to further reduce crosstalk.

Figure 12:
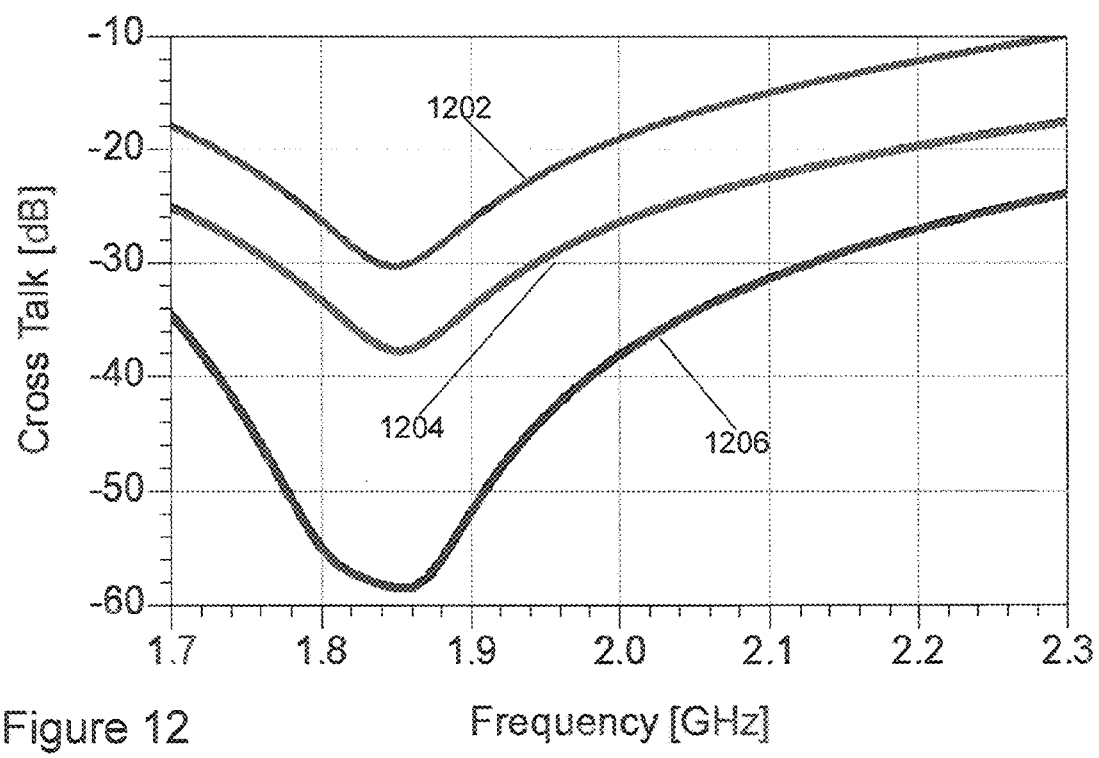
FIG. 12 shows a plot of crosstalk against frequency for the amplifier device of FIG. 4, the amplifier device of FIG. 7b and the amplifier device that has a shielding member that is not coupled to a capacitor.

FIG. 12 shows a plot of crosstalk against frequency simulations for the amplifier implemented in the device of FIG. 4 and two amplifier devices that comprise shielding members.

A first plot 1202 shows the performance of the performance of the amplifier of FIG. 4 (no shielding member), and is similar to the plot in FIG. 3. A second plot 1204 shows the performance of the performance of an amplifier with a shielding member without a capacitor. A third plot 1206 shows the performance of an amplifier with a shielding member and an external capacitor.

All of the plots 1202, 1204, 1206 have a minima at around 1.8 GHz and the general shape of the plots 1202, 1204, 1206 is similar. It can be seen that the most crosstalk is observed in the device without a shielding member (plots 1202), the device with a shielding member but no capacitor (plots 1204) exhibits a reduced crosstalk and the device with a shielding member and a capacitor (plots 1206) has the lowest crosstalk of all.

At the minima, the crosstalk of the first plot 1202 is −30 dB, the crosstalk of the second plot 1204 is around −37 dB and the crosstalk of the third plot 1206 is around −58 dB. At 2.1 GHz, which may be an operating frequency for a Doherty amplifier in some base station applications, the crosstalk of the first plot 1202 is around −5 dB, the crosstalk of the second plot 1204 is around −13 dB and the crosstalk of the third plot 1206 is around −32 dB. That is, the third plot provides a crosstalk below the required threshold of −25 dB.

It will be appreciated for FIGS. 11 and 12 that the provision of a capacitor results in significant improvement in device performance, both in terms of reduced crosstalk and loop impedance at a desired operating frequency.

FIG. 13 shows a plot of loop impedance against frequency for three different amplifier devices that have shielding members as disclosed herein. A first plot 1302 and a second plot 1304 in FIG. 13 are similar to those shown in FIG. 11. A third plot 1308 shows the impedance response of an amplifier with a shielding member and capacitor as described with reference to FIG. 9b. The arrangement of FIG. 9b produces a low loop impedance over a broad frequency range. In this example, the loop impedance is less than 30Ω between 1.7 and 2.3 GHz.

FIG. 14 shows a plot of crosstalk against frequency simulations for the amplifier implemented in the device of FIG. 4 and two amplifier devices that comprise shielding members.

A first plot 1402 shows the performance of the performance of the amplifier of FIG. 4 (no shielding member), and is similar to the plot in FIGS. 3 and 12.

A second plot 1405 shows the performance of an amplifier with a shielding member and multiple capacitors as illustrated in FIG. 9b. The second plot 1405 has two minima, at 1.85 GHz and 2.02 GHz. The cross talk levels at the minima are around −44 dB. Such an amplifier provides a broad frequency range (around 1.72 GHz to 2.3 GHz illustrated in FIG. 14) over which the cross talk is below the required threshold level of −25 dB.

A third plot 1406 shows the performance of an amplifier with a shielding member and an external capacitor, and is similar to the corresponding plot in FIG. 12.

The invention claimed is:

1. An amplifier device comprising:
   an integrated circuit die having a first amplifier and a second amplifier;
   a first connector having a first end coupled to the first amplifier and a second end for coupling with a circuit board;
   a second connector having a first end coupled to the second amplifier and a second end for coupling with a circuit board;
   a shielding member having a first end coupled to the integrated circuit die and a second end for coupling with a circuit board, the shielding member situated at least partially between the second connector and the first connector; and
   a capacitor with a first plate and a second plate, wherein the first plate of the capacitor is configured to be coupled to ground when in use, the second plate of the capacitor is coupled to one of the ends of the shielding member and the other end of the shielding member is configured to be coupled to ground when in use.

2. The amplifier device of claim 1, wherein the amplifier device is a Doherty amplifier device, the first amplifier is a main amplifier and the second amplifier is a peak amplifier.

3. The amplifier device of claim 2, wherein the amplifier device is an integrated Doherty amplifier, the integrated circuit die comprises the capacitor and the second plate of the capacitor is connected to the first end of the shielding member.

4. The amplifier device of claim 2, wherein the amplifier device comprises an integrated Doherty amplifier, the integrated Doherty comprises the integrated circuit die and the second plate of the capacitor is connected to the second end of the shielding member.

5. The amplifier device of claim 4, wherein the shielding member comprises a via through the integrated circuit die.

6. The amplifier device of claim 1, wherein the capacitor is a first capacitor and wherein the amplifier device comprises a second capacitor that has a first plate and a second plate,
   the first plate of the respective first capacitor and second capacitor is configured to be coupled to ground when in use,
   the second plate of the first capacitor is coupled to a first end of the shielding member, and
   the second plate of the second capacitor is coupled to a second end of the shielding member.

7. The amplifier device of claim 1, wherein the capacitor is a variable capacitor.

8. The amplifier device of claim 1, wherein the integrated circuit die comprises a ground plane that is configured to be coupled to ground.

9. The amplifier device of claim 8, wherein the shielding member comprises at least one shielding pin and the shielding pin is electrically coupled to the ground plane.

10. The amplifier device of claim 1, wherein the first and second amplifier connectors and the shielding member each extend in a common direction.

11. The amplifier device of claim 1, wherein the first connector and the second connector are input connectors or output connectors of the amplifier device.

12. The amplifier device of claim 1, wherein the shielding member comprises at least one of a bond wire, ribbon bond, leadframe, or clip leadframe.

13. The amplifier device of claim 1, further comprising a plurality of capacitors positioned along a length of the shielding member, wherein the capacitors are spaced apart from one another and are each coupled between ground and a different point on the length of the shielding member.

14. An apparatus comprising the amplifier device of claim 1 and a circuit board, wherein the second ends of the first connector, second connector and shielding member of the amplifier device are connected to the circuit board.

15. The apparatus of claim 14, wherein the first plate of the capacitor is coupled to a ground plane of the circuit board.

* * * * *